(12) United States Patent
Takemasa

(10) Patent No.: US 12,261,194 B2
(45) Date of Patent: Mar. 25, 2025

(54) DISPLAY DEVICE AND METHOD FOR MANUFACTURING THE SAME

(71) Applicant: Japan Display Inc., Tokyo (JP)

(72) Inventor: Kenichi Takemasa, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 497 days.

(21) Appl. No.: 17/686,430

(22) Filed: Mar. 4, 2022

(65) Prior Publication Data
US 2022/0302204 A1 Sep. 22, 2022

(30) Foreign Application Priority Data

Mar. 19, 2021 (JP) ................. 2021-046568

(51) Int. Cl.
*H01L 27/15* (2006.01)
*H01L 27/12* (2006.01)
*H01L 33/62* (2010.01)

(52) U.S. Cl.
CPC ........ *H01L 27/156* (2013.01); *H01L 27/1266* (2013.01); *H01L 33/62* (2013.01); *H01L 2933/0016* (2013.01); *H01L 2933/0066* (2013.01)

(58) Field of Classification Search
CPC ... H01L 27/156; H01L 27/1266; H01L 33/62; H01L 2933/0016
USPC .......................................................... 257/88
See application file for complete search history.

(56) References Cited

U.S. PATENT DOCUMENTS

| | | | |
|---|---|---|---|
| 2018/0031927 A1* | 2/2018 | Ikeda | G02F 1/133345 |
| 2018/0031974 A1 | 2/2018 | Prevatte et al. | |
| 2021/0280655 A1* | 9/2021 | Kanaya | H10K 59/131 |
| 2021/0296293 A1* | 9/2021 | Kanaya | G09F 9/00 |
| 2022/0199879 A1* | 6/2022 | Shimizu | H01L 27/156 |
| 2022/0367775 A1* | 11/2022 | Yamazaki | H01L 25/167 |

* cited by examiner

*Primary Examiner* — Igwe U Anya
(74) *Attorney, Agent, or Firm* — XSENSUS LLP

(57) ABSTRACT

A method for manufacturing a display device includes forming a drive circuit to drive an LED element on an insulating substrate; forming a light absorbing layer on the drive circuit; forming an insulating layer covering the light absorbing layer; forming a connecting electrode electrically connected to the drive circuit; arranging the LED element so that the connecting electrode is in contact with a terminal electrode of the LED element; and bonding the connecting electrode and the terminal electrode by irradiating laser light through a semiconductor layer of the LED element to the light absorbing layer.

8 Claims, 14 Drawing Sheets

DISPLAY DEVICE AND METHOD FOR MANUFACTURING THE SAME

CROSS REFERENCE TO RELATED APPLICATION

This application is based on and claims the benefit of priority from the prior Japanese Patent Application No. 2021-046568, filed on Mar. 19, 2021, the entire contents of which are incorporated herein by reference.

FIELD

One embodiment of the present invention relates to a display device and a method for manufacturing the same. In particular, the present invention relates to a display device with an LED (Light Emitting Diode) element and a method for manufacturing the same.

BACKGROUND

Recently, an LED display in which a minute LED element is mounted on each pixel is being developed as a next-generation display device. Normally, an LED display has a structure in which a plurality of LED elements is mounted on a circuit substrate constituting a pixel array. The circuit substrate has a drive circuit for emitting an LED at a position corresponding to each pixel. These drive circuits are electrically connected to each LED, respectively.

The aforementioned drive circuit and LED are electrically connected via a connecting electrode. Specifically, an electrode pad provided on the drive circuit side and an electrode pad provided on the LED element side are electrically connected. For example, U.S. Patent Application Publication No. 2018/0031974 describes a technique for bonding an LED element and a circuit substrate using an adhesive layer.

SUMMARY

A method for manufacturing a display device according to an embodiment of the present invention includes forming a drive circuit to drive an LED element on an insulating substrate; forming a light-absorbing layer on the drive circuit; forming an insulating layer covering the light-absorbing layer; forming a connecting electrode electrically connected to the drive circuit; arranging the LED element so that the connecting electrode is in contact with a terminal electrode of the LED element; and bonding the connecting electrode and the terminal electrode by irradiating laser light through a semiconductor layer of the LED element to the light-absorbing layer.

A display device according to an embodiment of the present invention includes a drive circuit on an insulating substrate; an absorbing layer on the drive circuit; an insulating layer covering the light-absorbing layer; a connecting electrode on the insulating layer, the connecting electrode electrically connected to the drive circuit; and an LED element electrically connected to the drive circuit via the connecting electrode.

DESCRIPTION OF EMBODIMENTS

Figure 1:
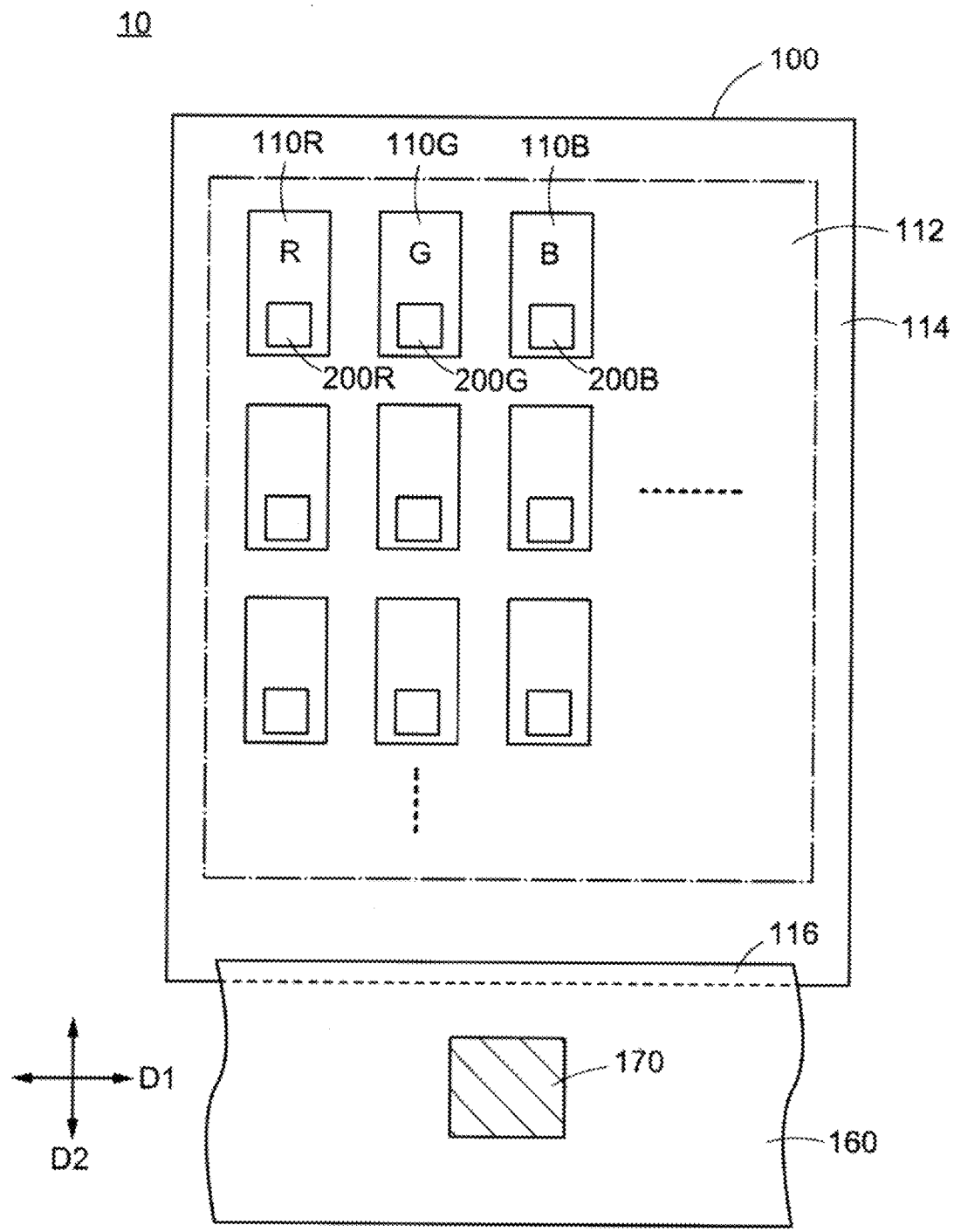
FIG. 1 is a plan view of a schematic configuration of a display device according to a first embodiment of the present invention.

In the case where an LED element and a circuit substrate are bonded to each other with an adhesive layer interposed therebetween as in the above-mentioned prior art, there is a fear that the LED element may be detached from the circuit substrate by strong vibrations. Also, in a final product manufactured using the adhesive layer as in the above-mentioned prior art, the adhesive layer remains between the circuit substrate and the LED. Since the adhesive layer is provided on the entire surface of the circuit substrate, there is a fear that a semiconductor element constituting the circuit is contaminated by alkaline components contained in organic substances and the like constituting the adhesive layer, thereby causing operation failure.

One object of the present invention is to firmly bond the LED element to the circuit substrate by a simple method.

Embodiments of the present invention will be described below with reference to the drawings and the like. However, the present invention can be implemented in various modes without departing from the gist thereof. The present invention is not to be construed as being limited to the description of the following exemplary embodiments. For the sake of clarity of description, the drawings may be schematically represented with respect to widths, thicknesses, shapes, and the like of the respective portions in comparison with actual modes. However, the drawings are merely examples and do not limit the interpretation of the present invention.

In describing the present embodiment, direction from a substrate to an LED element is "above" and the opposite direction is "below". However, the expression "above" or "below" merely describes the upper limit relationship of each element. For example, the expression that an LED element is arranged on a substrate also includes the presence of other members between the substrate and the LED element. Furthermore, the terms "above" or "below" include not only the case where the elements overlap but also the case where they do not overlap in a plan view. The expression "directly above" or "directly below" refers to the case where the elements overlap in a plan view.

In this specification and claims, a plurality of elements formed by performing a processing such as an etch on a film may be described as elements having different functions or different roles, respectively. The plurality of elements is composed of the same layer structure and the same material and are described as elements in the same layer. In the case where the plurality of elements formed by different processes is provided above the same other element and in contact with the other element, the plurality of elements is also described as elements in the same layer.

In this specification, the expressions "a includes A, B, or C", "a includes any of A, B, and C", and "a includes one selected from a group consisting of A, B, and C" do not exclude the case where a includes multiple combinations of A to C unless otherwise specified. Furthermore, these expressions do not exclude the case where a includes other elements.

In the description of the embodiment of the present invention, elements having the same functions as those of the elements already described are denoted by the same symbols or the same symbols with symbols such as alphabets, and the description thereof may be omitted. For example, in the case where there is a plurality of elements to which a certain symbol is attached in the drawings, the elements may be distinguished by attaching "a", "b" and the like to the symbols. On the other hand, in the case where it is not necessary to distinguish each element, only the symbol indicating the element will be used. Similarly, in the case where an element needs to be described separately for each color of RGB, it may be distinguished by the symbols R, G, or B after the symbols indicating the element. On the other hand, in the case where the elements need not be described separately for each color of RGB, only a symbol indicating the elements will be used.

First Embodiment

[Configuration of Display Device]

A configuration of a display device 10 according to an embodiment of the present invention will be described with reference to FIG. 1 to FIG. 4.

FIG. 1 is a plan view showing a schematic configuration of the display device 10 according to a first embodiment of the present invention. As shown in FIG. 1, the display device 10 includes a circuit substrate 100, a flexible printed circuit board 160 (FPC 160), and an IC element 170. The display device 10 is divided into a display area 112, a peripheral area 114, and a terminal area 116. The circuit substrate 100 is sometimes referred to as a TFT substrate, a backplane substrate, an array substrate, or the like.

The display area 112 is an area in which a plurality of pixels 110 including an LED element 200 is arranged in row direction (D1 direction) and column direction (D2 direction). Specifically, in the present embodiment, a pixel 110R including an LED element 200R, a pixel 110G including an LED element 200G, and a pixel 1106 including an LED element 200B are arranged. The display area 112 functions as an area for displaying an image corresponding to a video signal.

The peripheral area 114 is an area around the display area 112. The peripheral area 114 is an area provided with driver circuits (a data driver circuit 130 and a gate driver circuit 140 shown in FIG. 2) for controlling pixel circuits (pixel circuits 120R, 120G, and 120B shown in FIG. 2) provided in each pixel 110.

The terminal area 116 is an area in which a plurality of wirings connected to the aforementioned driver circuits is aggregated. The flexible printed circuit board 160 is electrically connected to a plurality of wiring in the terminal area 116. A video signal (data signal) or control signal output from an external device (not shown) is input to the IC element 170 via the wiring (not shown) provided in the flexible printed circuit board 160. The IC element 170 performs various signal processing on the video signal and generates a control signal required for display control. The video signal and control signal output from the IC element 170 are input to the display device 10 via the flexible printed circuit board 160.

[Circuit Configuration of Display Device]

Figure 2:
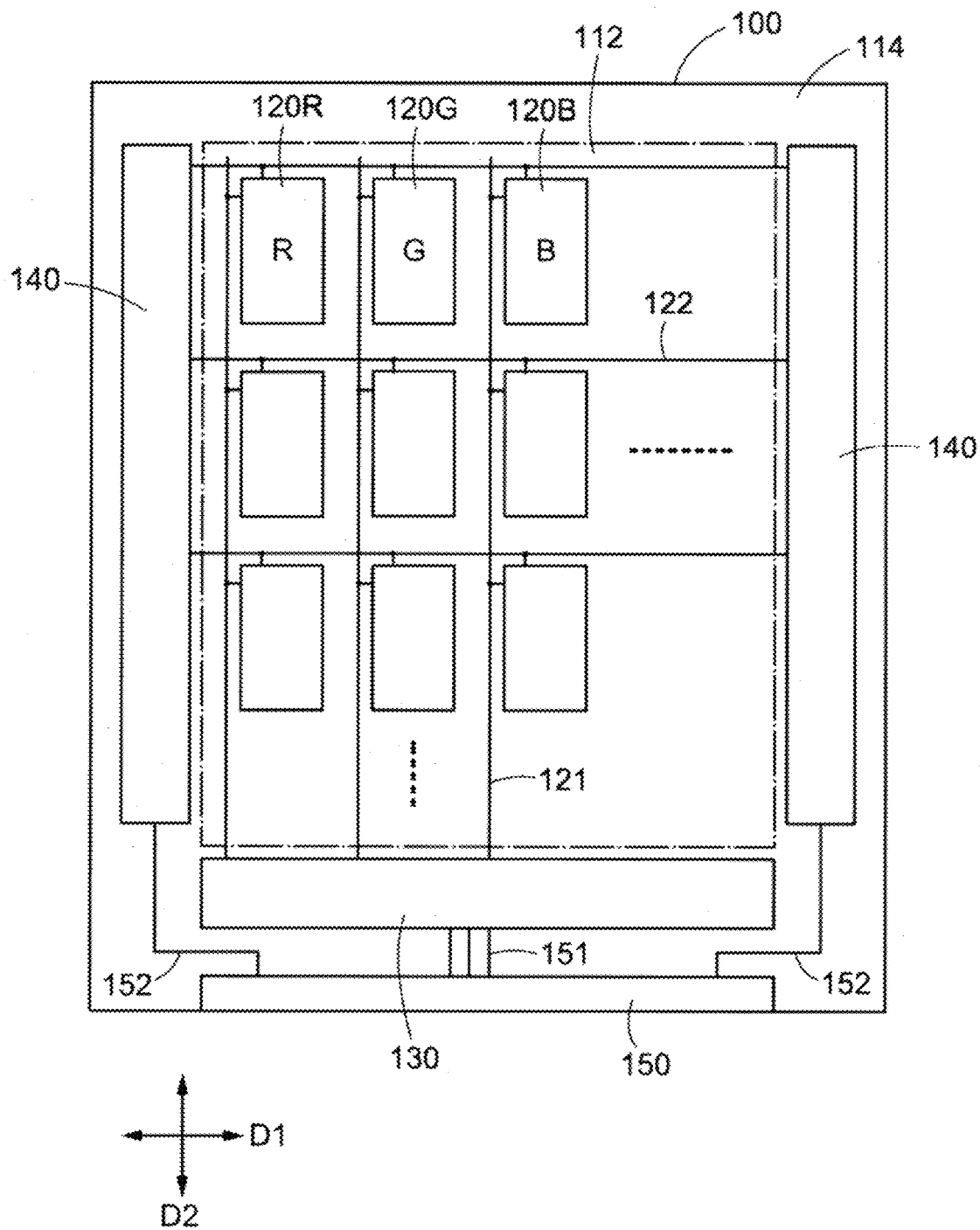
FIG. 2 is a block diagram of a circuit configuration of the display device according to the first embodiment of the present invention.

FIG. 2 is a block diagram showing a circuit configuration of the display device 10 according to the first embodiment of the present invention. As shown in FIG. 2, the display area 112 is provided with the pixel circuit 120 corresponding to each pixel 110. In the present embodiment, the pixel circuit 120R, the pixel circuit 120G, and the pixel circuit 120B are provided corresponding to the pixel 110R, the pixel 110G, and the pixel 1106, respectively. That is, a plurality of pixel circuits 120 is arranged in the row direction (D1 direction) and the column direction (D2 direction) in the display area 112.

Figure 3:
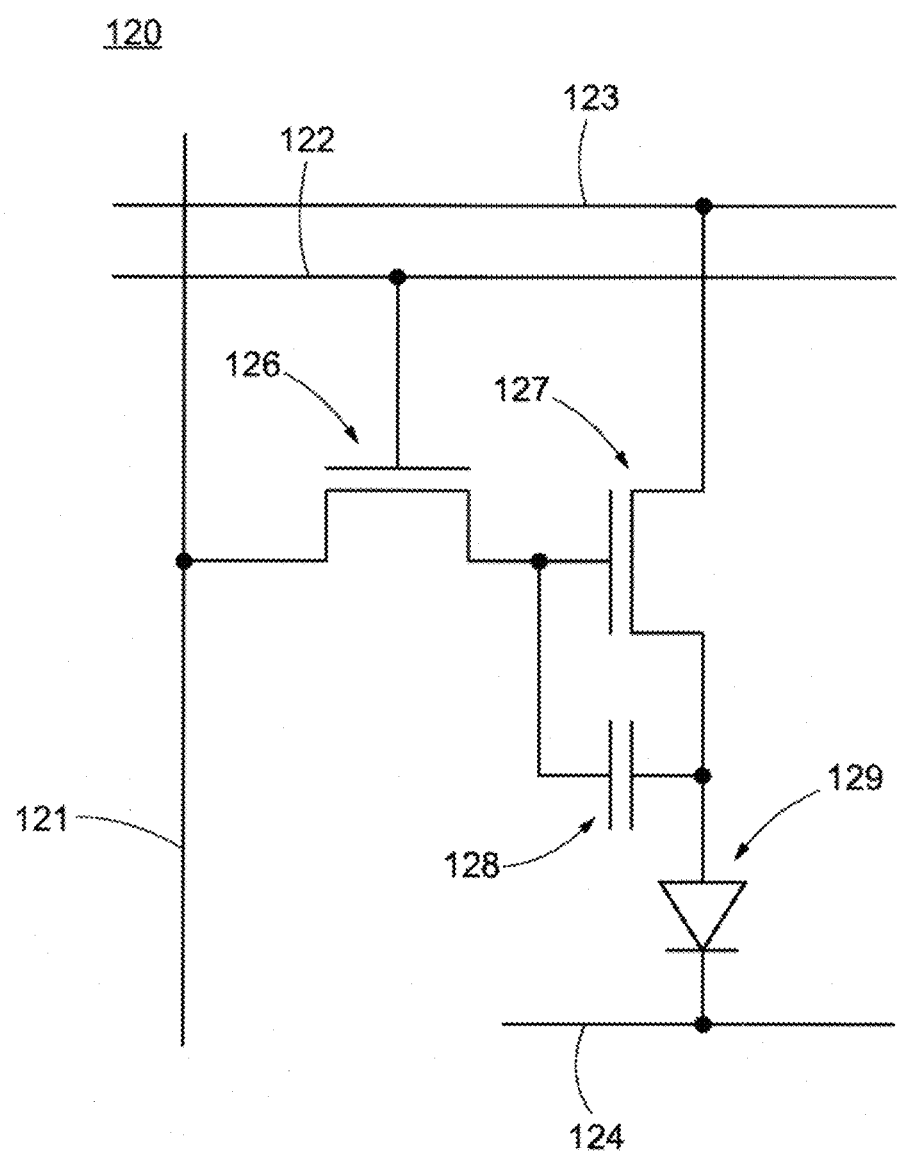
FIG. 3 is a circuit diagram of a configuration of a pixel circuit of the display device according to the first embodiment of the present invention.

FIG. 3 is a circuit diagram showing a configuration of the pixel circuit 120 in the display device 10 of the first embodiment of the present invention. The pixel circuit 120 is arranged in an area surrounded by a data line 121, a gate line 122, an anode power line 123, and a cathode power line 124. The pixel circuit 120 of the present embodiment includes a select transistor 126, a drive transistor 127, a storage capacity 128, and an LED 129. The LED 129 corresponds to the LED element 200 shown in FIG. 1. Of the pixel circuit 120, circuit elements other than the LED 129 corresponds to a drive circuit 125 provided in the circuit substrate 100 (see FIG. 4). That is, the pixel circuit 120 is completed with the LED element 200 mounted on the circuit substrate 100.

As shown in FIG. 3, a source electrode, gate electrode, and drain electrode of the select transistor 126 are connected to the data line 121, the gate line 122, and a gate electrode of the drive transistor 127, respectively. The source electrode, gate electrode, and drain electrode of the drive transistor 127 are connected to the anode power line 123, a drain electrode of the select transistor 126, and the LED 129, respectively. The storage capacity 128 is connected between the gate electrode and the drain electrode of the drive transistor 127. That is, the storage capacity 128 is connected to the drain electrode of the select transistor 126. The anode and cathode of the LED 129 are connected to the drain electrode of the drive transistor 127 and the cathode power line 124, respectively.

A gradation signal for determining an emission intensity of the LED 129 is supplied to the data line 121. A gate signal for selecting the select transistor 126 that writes the gradation signal is supplied to the gate line 122. When the select transistor 126 is turned on, the gradation signal is stored in the storage capacity 128. Thereafter, when the drive transistor 127 is turned on, a drive current corresponding to the gradation signal flows through the drive transistor 127. When the drive current output from the drive transistor 127 is input to the LED 129, the LED 129 emits light with a light emission intensity corresponding to the gradation signal.

Referring to FIG. 2 again, a data driver circuit 130 is arranged at a position adjacent to the display area 112 in the column direction (D2 direction). A gate driver circuit 140 is arranged at a position adjacent to the display area 112 in the row direction (D1 direction). In the present embodiment, although two gate driver circuits 140 are provided on both sides of the display area 112, it may be only one of them.

Both the data driver circuit 130 and the gate driver circuit 140 are arranged in the peripheral area 114. However, the area where the data driver circuit 130 is arranged is not limited to the peripheral area 114. For example, the data driver circuit 130 may be arranged on the flexible printed circuit board 160.

The data line 121 shown in FIG. 3 extends from the data driver circuit 130 toward the column direction and is connected to the source electrode of the select transistor 126 in each pixel circuit 120. The gate line 122 extends from the gate driver circuit 140 toward the row direction and is connected to the gate electrode of the select transistor 126 in each pixel circuit 120.

A terminal portion 150 is arranged in the terminal area 116. The terminal portion 150 is connected to the data driver circuit 130 via a connecting wiring 151. Similarly, the terminal portion 150 is connected to the gate driver circuit 140 via a connecting wiring 152. In addition, the terminal portion 150 is connected to the flexible printed circuit board 160.

[Cross-Sectional Structure of Pixel]

Figure 4:
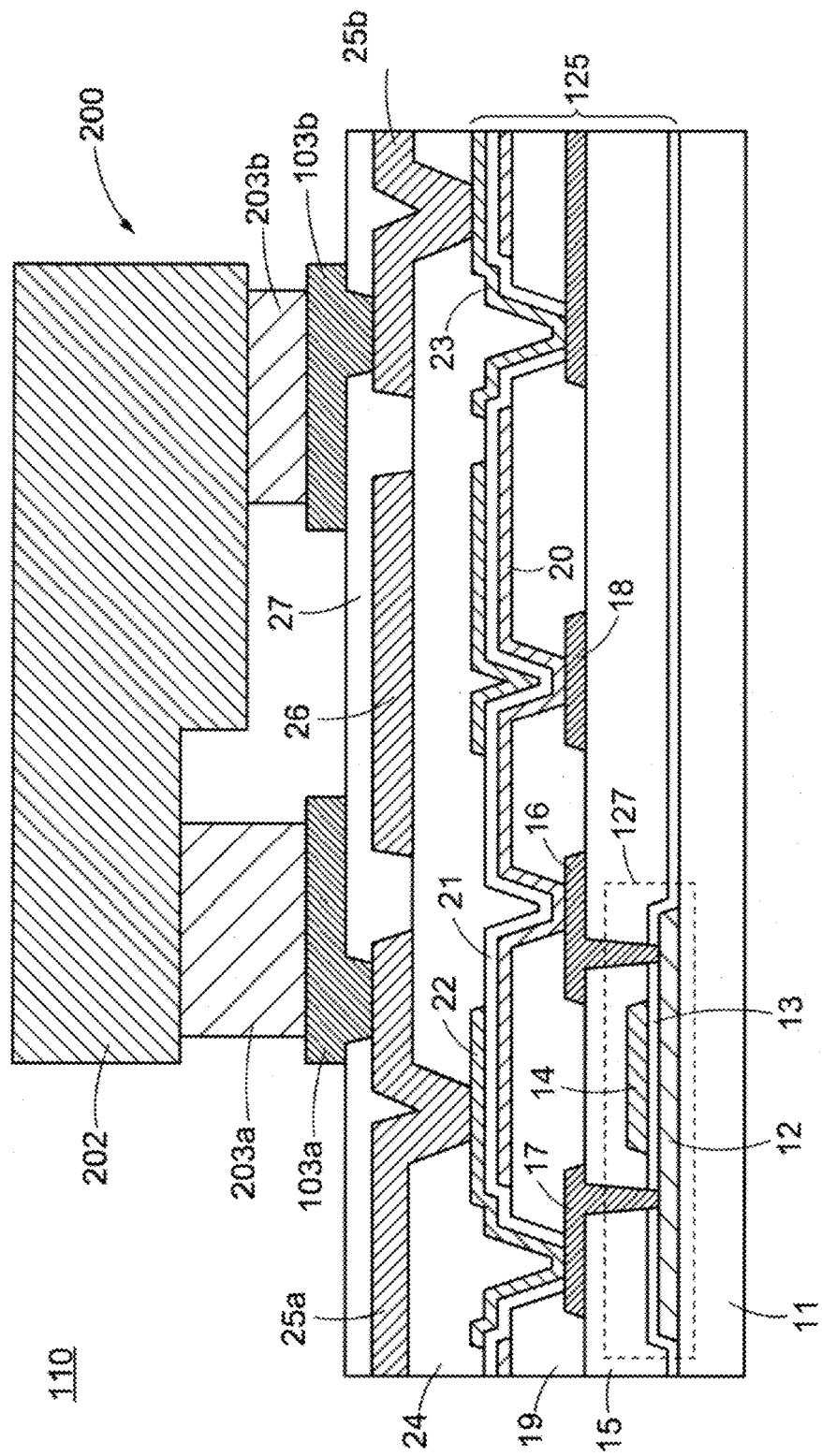
FIG. 4 is a cross-sectional view of a configuration of a pixel of the display device according to the first embodiment of the present invention.

FIG. 4 is a cross-sectional view showing a configuration of the pixel 110 in the display device 10 according to the first embodiment of the present invention. The pixel 110 includes the drive transistor 127 provided on an insulating substrate 11. A glass substrate, a resin substrate, a ceramic substrate or a substrate in which an insulating layer is provided on a metal substrate can be used as the insulating substrate 11. In the case where the resin substrate is used as the insulating substrate 11, flexibility can be applied to the display device 10.

The drive transistor 127 includes a semiconductor layer 12, a gate insulating layer 13, and a gate electrode 14. A source electrode 16 and a drain electrode 17 are connected to the semiconductor layer 12 via an insulating layer 15. Although not shown, the gate electrode 14 is connected to a drain electrode of the select transistor 126 shown in FIG. 3.

A wiring 18 is provided in the same layers as the source electrode 16 and the drain electrode 17. The wiring 18 functions as the anode power line 123 shown in FIG. 3. Therefore, the source electrode 16 and the wiring 18 are electrically connected by a connecting wiring 20 provided on a planarization layer 19. The planarization layer 19 is a transparent resin layer using a resinous material such as polyimide or acrylic. The connecting wiring 20 is a transparent conductive layer using a metal oxide material such as ITO. However, the present invention is not limited to this example, and other metal materials may be used as the connecting wiring 20.

An insulating layer 21 made of silicon nitride or the like is provided on the connecting wiring 20. An anode electrode 22 and a cathode electrode 23 are provided on the insulating layer 21. The anode electrode 22 and the cathode electrode 23 are made of a metal material. The anode electrode 22 is connected to the drain electrode 17 via an opening provided in the planarization layer 19 and the insulating layer 21. When the anode electrode 22 and cathode electrodes 23 are formed, the drive circuit 125 is completed. Although not shown in FIG. 4, in addition to the drive transistor 127, the select transistor 126 and the storage capacity 128 are formed.

The anode electrode 22 and the cathode electrode 23 are connected to mounting pads 25a and 25b via a planarization layer 24, respectively. The mounting pad 25a functions as an intermediate layer for electrically connecting the drive transistor 127 and the LED element 200. The mounting pad 25b functions as an intermediate layer for electrically connecting the LED element 200 and the cathode electrode 23.

In the present embodiment, a light-absorbing layer 26 is formed together with the mounting pads 25. The light-absorbing layer 26 functions as a layer for absorbing laser light and converting it into thermal energy. As will be described later, the light-absorbing layer 26 is used for melt bonding between connecting electrodes 103 and terminal electrodes 203 by irradiating the laser light to emit the thermal energy generated by absorbing the laser light.

The light-absorbing layer 26 is desirably made of a material that exhibits a relatively higher absorptance at the wavelength of light transmitted through a semiconductor layer 202 of the LED element 200 to be described later. In the present embodiment, since a semiconductor material containing gallium nitride which transmits near-infrared light is used as the semiconductor layer 202, light emitted from a YAG laser or $YVO_4$ laser (wavelength: about 1064 nm) is used as the laser light. Therefore, the light-absorbing layer 26 desirably has a light absorption rate of 20% or more (preferably, 30% or more) at a wavelength of 1.0 μm or more and 1.5 μm or less. A metal material (including an alloy material) including tungsten, chromium, cobalt, molybdenum, titanium, zinc, nickel, or iron can be used as such a material. In particular, tungsten is suitable as the light-absorbing layer 26 because tungsten has near-infrared light absorptance of 30% or more at a wavelength around 1.0 μm. A metal layer using these materials may be a single layer, or two or more kinds of metal layers may be stacked. Not limited to the metal material, a metal oxide such as aluminum oxide can be used as the material constituting the light-absorbing layer 26.

In the present embodiment, the mounting pad 25 and the light-absorbing layer 26 are formed by the same process. That is, the mounting pad 25 and the light-absorbing layer 26 are formed in the same layer using the same material. The mounting pad 25 and the light-absorbing layer 26 are formed of a metal layer containing tungsten. As shown in FIG. 4, the light-absorbing layer 26 is arranged directly below the semiconductor layer 202 of the LED element 200.

Specifically, the light-absorbing layer 26 is arranged between a connecting electrode 103a and a connecting electrode 103b. In this case, in a plan view, the light-absorbing layer 26 desirably overlaps the connecting electrode 103a and the connecting electrode 103b. As a result, when the light-absorbing layer 26 is irradiated with infrared light, the thermal conductivity from the light-absorbing layer 26 to the connecting electrodes 103a and 103b can be improved. However, the present invention is not limited to this example, and the light-absorbing layer 26 may not overlap with the connecting electrode 103.

An insulating layer 27 is provided on the mounting pad 25 and the light-absorbing layer 26. The insulating layer 27 has the function of insulating the connecting electrode 103 and the light-absorbing layer 26 and transmitting thermal energy radiated from the light-absorbing layer 26 to the connecting electrode 103. Therefore, a high-thermal-conductivity insulating material is preferably used as the insulating layer 27. For example, it is desirable that the thermal conductivity of the insulating layer 27 is 10 W/m-K or more (preferably 20 W/m-K or more) at room temperature. Since the insulating layer 27 needs to transmit the infrared light irradiated to the light-absorbing layer 26, it is desirable that the transmittance of the infrared light layer is also high.

In view of the above circumstances, in the present embodiment, aluminum oxide (including sapphire) or silicon nitride is used as the insulating layer 27. In particular, since aluminum oxide has high transmittance of infrared light and it is excellent in thermal conductivity, it is possible to transfer heat efficiently during the melt bonding of the connecting electrodes 103 and the terminal electrodes 203 by irradiation of infrared light to be described later.

The insulating layer 27 may function as a planarization layer to release an unevenness caused by the mounting pad 25 and the light-absorbing layer 26. In this instance, the insulating layer 27 preferably has a thickness sufficiently thicker than the thicknesses of the mounting pad 25 and the light-absorbing layer 26.

The connecting electrode 103a and the connecting electrode 103b are provided on the insulating layer 27. The connection electrodes 103a and 103b are connected to the mounting pads 25a and 25b, respectively, via openings provided in the insulating layer 27. In the present embodiment, an electrode made of tin (Sn) is arranged as the connecting electrode 103.

The LED element 200 is arranged on the connecting electrodes 103a and 103b. The LED element 200 includes the semiconductor layer 202, a terminal electrode 203a, and a terminal electrode 203b. The semiconductor layer 202 functions as a photoelectric conversion layer including n-type semiconductor layer and p-type semiconductor layer. In the present embodiment, although the semiconductor layer 202 is configured using a semiconductive material containing gallium nitride, it is not limited to this example.

In the present embodiment, as shown in FIG. 3, the anode of the LED element 200 is connected to the drive transistor 127. Therefore, the terminal electrode 203a is connected to the p-type semiconductor layer of the semiconductor layer 202 and to the connecting electrode 103a. The terminal electrode 203b is connected to the n-type semiconductor layer of the semiconductor layer 202 and is connected to the connecting electrode 103b.

In the present embodiment, the terminal electrode 203 is an electrode made of gold (Au). As will be described later, the connecting electrode 103 and the terminal electrode 203 are bonded by melt bonding by laser light irradiation. Therefore, there is an alloy layer (eutectic alloy containing tin and gold) (not shown) between the connecting electrode 103 and the terminal electrode 203. As described above, since the connecting electrode 103 and the terminal electrode 203 are heated to a temperature at which the alloy layer is formed, the light-absorbing layer 26 has a melting point higher than the alloy layer.

The LED element 200 corresponds to the LED 129 in the circuit diagram shown in FIG. 3. Specifically, the terminal electrodes 203a of the LED element 200 is connected to the anode electrode 22 connected to the drain electrode 17 of the drive transistor 127. The terminal electrode 203b of the LED element 200 is connected to the cathode electrode 23. The cathode electrode 23 is electrically connected to the cathode power line 124 shown in FIG. 3.

Since the LED element 200 is firmly mounted by melt bonding by infrared light radiation, the display device 10 of the present embodiment having the above structure has the advantage of high resistance to impact and the like.

[Manufacturing Method of Display Device]

Figure 5:
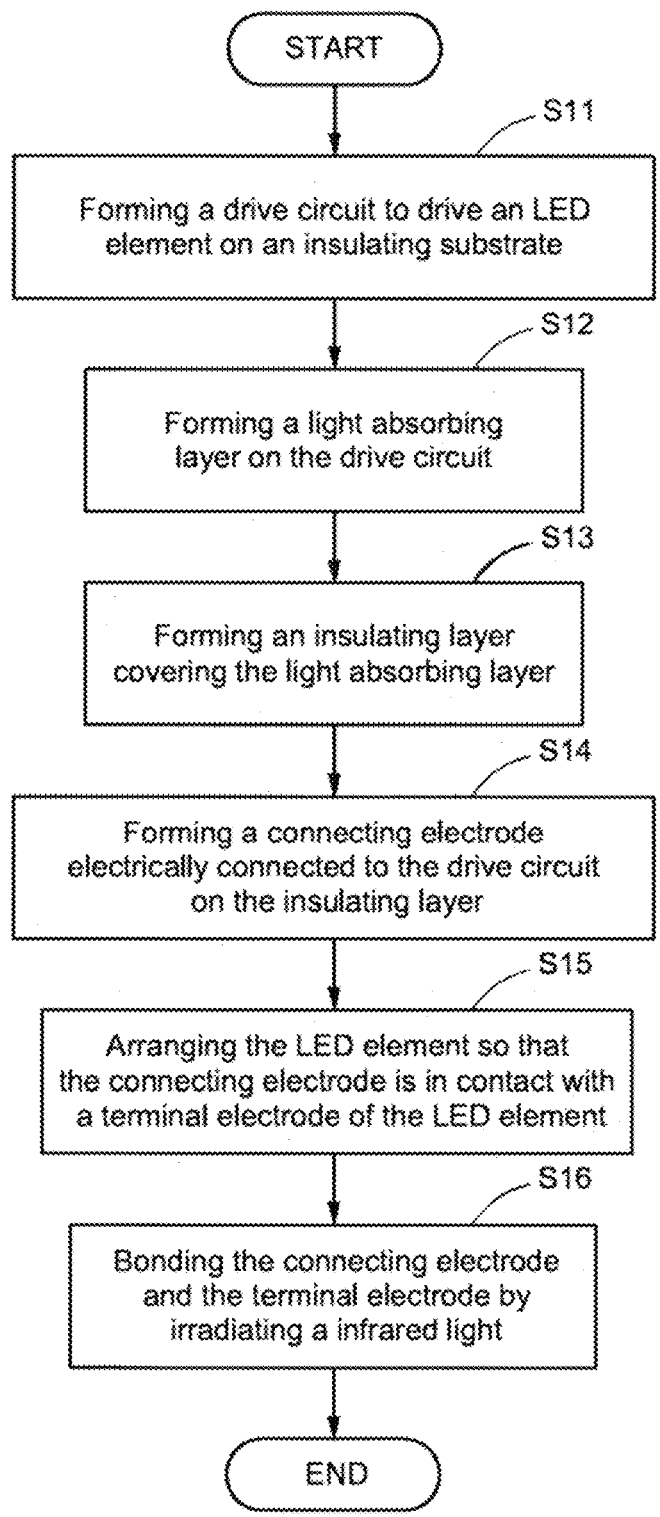
FIG. 5 is a flowchart diagram of a manufacturing method of the display device according to the first embodiment of the present invention.

FIG. 5 is a flowchart showing a manufacturing method of the display device 10 according to the first embodiment of the present invention. FIG. 6 to FIG. 11 are cross-sectional views showing a manufacturing method of the display device 10 according to the first embodiment of the present invention. Hereinafter, a manufacturing method of the display device 10 will be described with reference to FIG. 5. At that time, a cross-sectional structure in each manufacturing process will be described with reference to FIG. 6 to FIG. 11.

Figure 6:
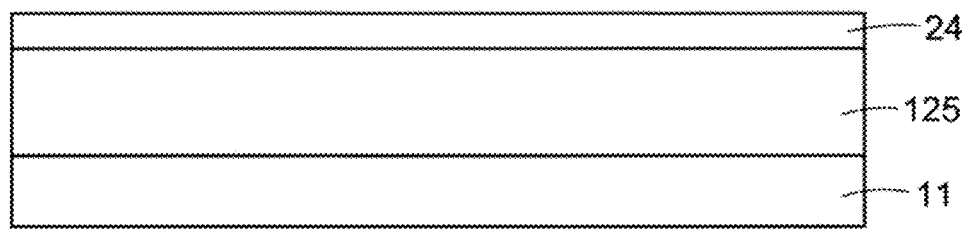
FIG. 6 is a cross-sectional view of a manufacturing process of the display device according to the first embodiment of the present invention.

First, in step S11 of FIG. 5, the drive circuit 125 for driving the LED element 200 is formed on the insulating substrate 11. FIG. 6 shows a cross-sectional structure corresponding to step S11 of FIG. 5. For example, a glass substrate, a resin substrate, a ceramic substrate, or a metal substrate can be used as the insulating substrate 11. Although not shown in FIG. 6, the drive circuit 125 of the present embodiment includes the select transistor 126 and the storage capacity 128 in addition to the drive transistor 127. However, the configuration of the drive circuit 125 is not limited to this example and may include other circuit elements as required.

Since the drive circuit 125 can be formed using a normal thin film forming technique, the description of the specific manufacturing process of the drive circuit 125 will be omitted. After the drive circuit 125 is formed on the insulating substrate 11, the planarization layer 24 is formed to planarize undulations caused by the drive circuit 125.

Figure 7:
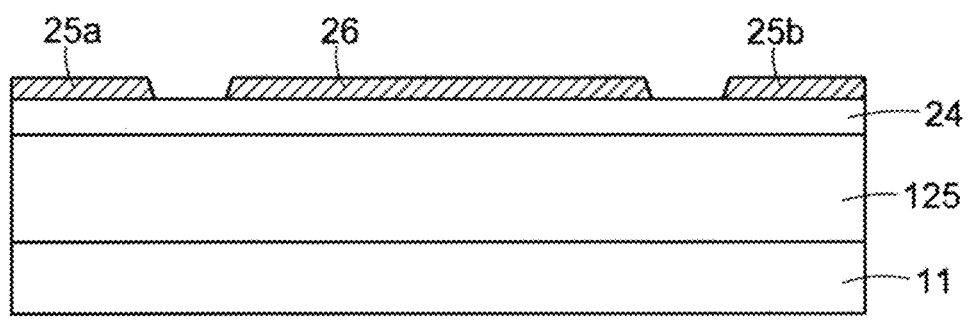
FIG. 7 is a cross-sectional view of a manufacturing process of the display device according to the first embodiment of the present invention.

Next, in step S12 of FIG. 5, the mounting pad 25a, the mounting pad 25b, and the light-absorbing layer 26 are formed on the drive circuit 125 (specifically, on the planarization layer 24 covering the drive circuit 125). FIG. 7 shows a cross-sectional structure corresponding to step S12 of FIG. 5. Although not shown, the mounting pads 25a and 25b are connected to the anode electrode 22 and the cathode electrode 23, respectively, as shown in FIG. 4.

In the present embodiment, the mounting pad 25a, the mounting pad 25b and the light-absorbing layer 26 are formed on the planarization layer 24 covering the drive circuit 125 by the same process using the same material. In the present embodiment, tungsten is used as a constituent material. Therefore, the mounting pad 25a, the mounting pad 25b and the light-absorbing layer 26 are formed of the same metal layer made of tungsten. In the present embodiment, the mounting pad 25a, the mounting pad 25b, and the light-absorbing layer 26 are formed by a sputtering method.

Figure 8:
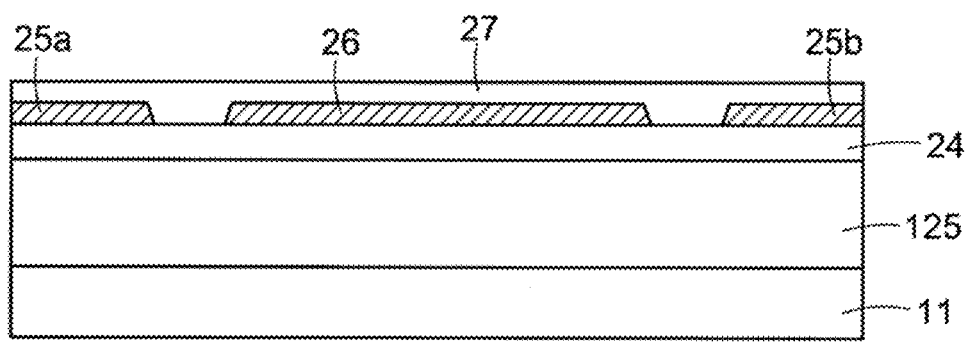
FIG. 8 is a cross-sectional view of a manufacturing process of the display device according to the first embodiment of the present invention.

Next, in step S13 of FIG. 5, the insulating layer 27 covering the light-absorbing layer 26 is formed. FIG. 8 shows a cross-sectional structure corresponding to step S13 of FIG. 5. The insulating layer 27 is a layer for insulating the connecting electrode 103 to be formed later and the light-absorbing layer 26. In the present embodiment, an insulating layer made of aluminium oxide is used as the insulating layer 27. The insulating layer made of aluminium oxide can be formed by, for example, a sputtering method.

Figure 9:
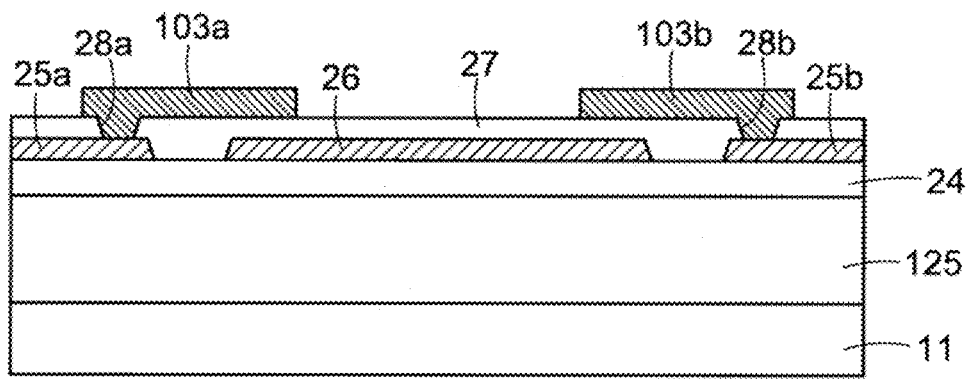
FIG. 9 is a cross-sectional view of a manufacturing process of the display device according to the first embodiment of the present invention.

Next, in step S14 of FIG. 5, the connecting electrode 103a and the connecting electrode 103b electrically connected to the drive circuit 125 are formed on the insulating layer 27. FIG. 9 shows a cross-sectional structure corresponding to step S14 of FIG. 5. In the present embodiment, tin (Sn) is used as a constituent material of the connecting electrode 103. However, the present invention is not limited to this example, and other metallic materials capable of forming a eutectic alloy between the terminal electrode 203 of the LED element 200 to be described later may be used. For example, both the connecting electrode 103 and the terminal electrode 203 may be made of tin (Sn). A thickness of the connecting electrode 103 may be 0.2 μm or more and 5 μm or less (preferably 1 μm or more and 3 μm or less).

The connection electrode 103 is formed to match the position of the mounting pad 25. Specifically, after the insulating layer 27 is formed in step S13 of FIG. 5, an opening 28a and an opening 28b are formed on the insulating layer 27 at a position corresponding to the mounting pads 25a and 25b, respectively. Thereafter, the connecting electrode 103 that is electrically connected to the mounting pad 25 is formed on the insulating layer 27. In this case, each of the connecting electrodes 103a and 103b are desirably formed so as to overlap with the light-absorbing layer 26 in a plan view. With such a structure, it is possible to improve the thermal conductivity from the light-absorbing layer 26 to the connecting electrodes 103a and 103b when the laser light to be described later is irradiated.

Figure 10:
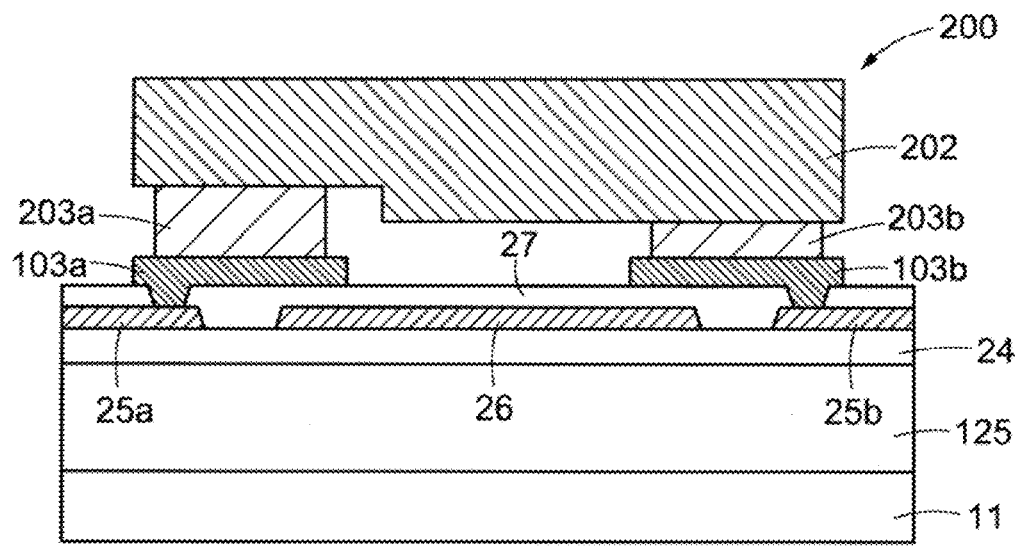
FIG. 10 is a cross-sectional view of a manufacturing process of the display device according to the first embodiment of the present invention.

Next, in step S15 of FIG. 5, the LED element 200 is arranged so that the connecting electrode 103 and the terminal electrode 203 of the LED element 200 are in contact with each other. FIG. 10 shows a cross-sectional structure corresponding to step S15 of FIG. 5. In this case, the terminal electrode 203a is located above the connecting electrode 103a, and the terminal electrode 203b is located above the connecting electrode 103b. Although only one LED element 200 is shown in FIG. 10, in practice, the LED element 200 is arranged in each pixel.

A plurality of LED elements 200 may be collectively aligned with respect to the connecting electrode 103. For example, the plurality of LED elements 200 is formed on a semiconductor substrate such as a sapphire substrate to match the pixel pitch. Thereafter, the plurality of LED elements 200 and a plurality of terminal electrodes 203 provided in each pixel may be aligned collectively.

As shown in FIG. 10, in the present embodiment, an example of mounting a flip-element type LED element 200 having the two terminal electrodes 203a and 203b on the surface facing the drive circuit 125 will be described. However, the form of the LED element 200 is not limited to this example. For example, the LED element 200 may be constructed with an anode electrode (or cathode electrode) on a side closer to the drive circuit 125 and a cathode electrode (or anode electrode) on a side farther from the drive circuit 125. That is, the LED element 200 may be a face-up type LED element having a structure in which a light-emitting layer is sandwiched between the anode electrode and the cathode electrode. In the case where a face-up type LED element is used as the LED element 200, the connecting electrode 103 may be provided one for each pixel.

The LED element 200 shown in FIG. 10 includes the semiconductor layer 202 made of a semiconducting material containing gallium nitride grown on a semiconductor substrate (not shown). In the present embodiment, a sapphire substrate is used as the semiconductor substrate. However, combinations of a material constituting the semiconductor substrate and a material constituting the semiconductor layer 202 of the LED element 200 may be appropriately determined according to an emission color of the LED element 200.

Figure 11:
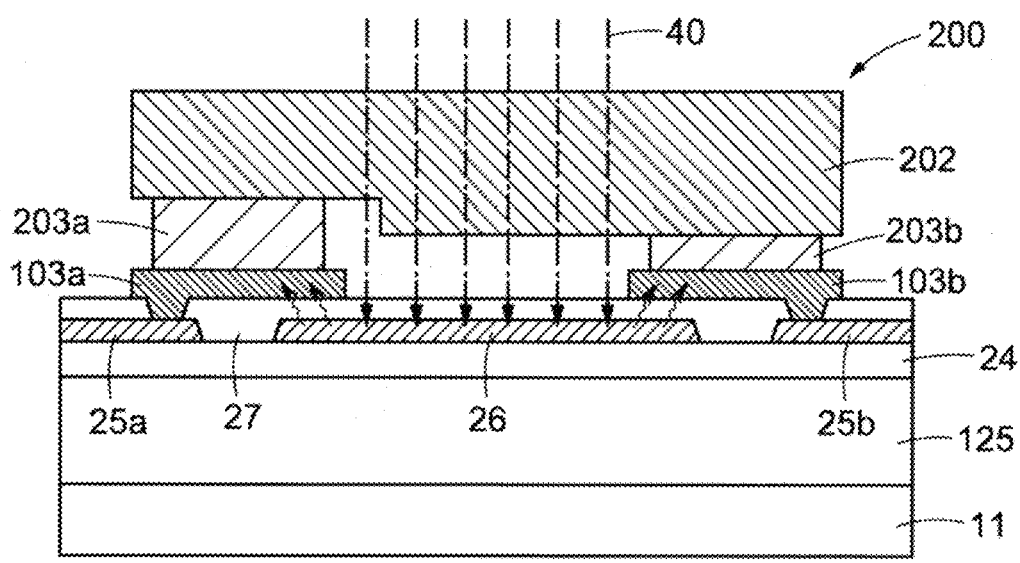
FIG. 11 is a cross-sectional view of a manufacturing process of the display device according to the first embodiment of the present invention.

Next, in step S16 of FIG. 5, the connecting electrode 103 and the terminal electrode 203 are bonded by irradiating the light-absorbing layer 26 with a laser light 40 via the semiconductor layer 202 of the LED element 200. FIG. 11 shows a cross-sectional structure corresponding to step S16 in FIG. 5. In the present embodiment, near-infrared light (wavelength: about 1064 nm) emitted from a YAG laser or YVO$_4$ laser is used as the laser light 40.

As shown in FIG. 11, the laser light 40 emitted from an external light source is transmitted through the semiconductor layer 202 of the LED element 200 and is irradiated to the light-absorbing layer 26. In the present embodiment, since the semiconductor layer 202 is a gallium nitride-based semiconductor material, it transmits near-infrared light. On the other hand, since the light-absorbing layer 26 is made of tungsten, which has relatively high absorptivity to near-infrared light, it efficiently absorbs the laser light 40 and converts it into heat.

Heat generated in the light-absorbing layer 26 is transferred to the connecting electrode 103 via the insulating layer 27 having excellent heat transfer. The heat transferred to the connecting electrode 103 is also transferred to the terminal electrode 203 of the LED element 200. That is, due to the thermal radiation from the light-absorbing layer 26, sufficient heat is transferred to an interface between the connecting electrode 103 and the terminal electrode 203, and the connecting electrode 103 and the terminal electrode 203 are melt-bonded. At this time, although not shown, an alloy layer (eutectic alloy containing tin and gold) is formed between the connecting electrode 103 and the terminal electrode 203. In the present embodiment, the connecting electrode 103 and the terminal electrode 203 are firmly bonded by forming an alloy layer composed of a eutectic alloy between the connecting electrode 103 and the terminal electrode 203.

As described above, in the present embodiment, by irradiating laser light, the terminal electrode 203 of the LED element 200 and the connecting electrode 103 connected to the drive circuit 125 are melt bonded. At that time, the light-absorbing layer 26 arranged directly below the semiconductor layer 202 of the LED element 200 is used as a heat-generating source. That is, the laser light transmitted through the semiconductor layer 202 and irradiated to the light-absorbing layer 26 is converted into heat by the light-absorbing layer 26 and is transmitted to the connecting electrode 103 via the insulating layer 27.

Figure 12:
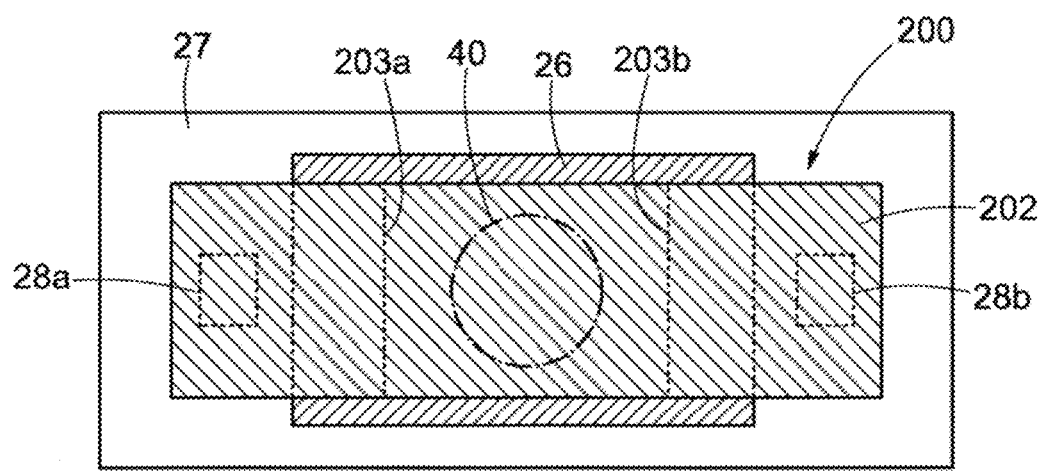
FIG. 12 is an enlarged plan view of a vicinity of an LED element in the pixel of the first embodiment of the present invention.

FIG. 12 is an enlarged plan view of a vicinity of the LED element 200 in the display device 10 of the first embodiment. As shown in FIG. 12, in the present embodiment, since it is sufficient to irradiate the laser light 40 so as to hit the light-absorbing layer 26 directly below the semiconductor layer 202, a spot diameter of the laser light 40 can be set small. That is, according to the present embodiment, by reducing the spot diameter of the laser light 40, an energy density of the laser light 40 can be increased, and the laser light irradiation can be performed efficiently. Further, since the connecting electrode 103 can be heated by efficiently converting the light energy received by the light-absorbing layers 26 into heat, the loss of light energy can be suppressed.

Figure 13:
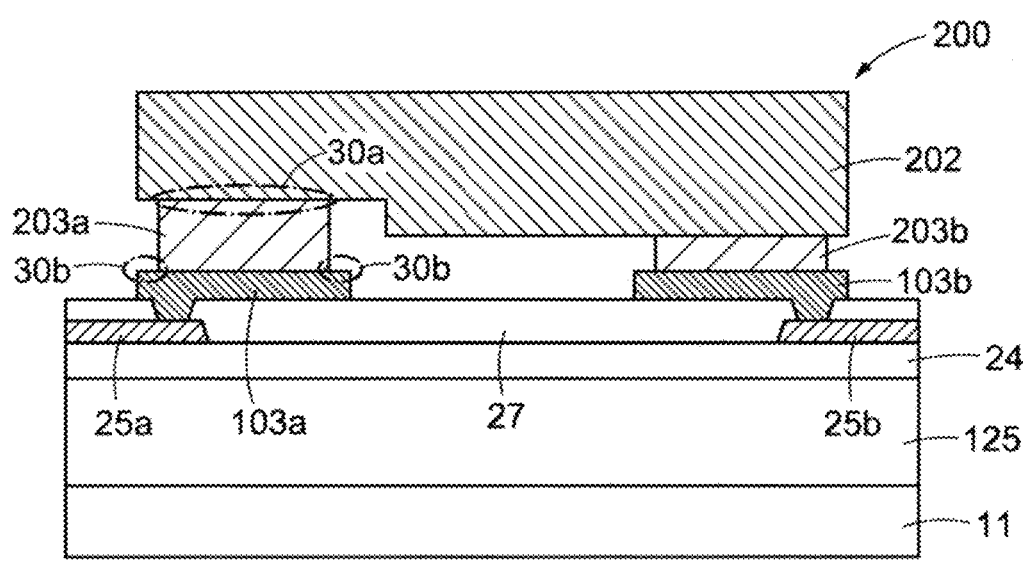
FIG. 13 is an enlarged cross-sectional view of a vicinity of an LED element in a pixel of a comparative example.

On the other hand, in a comparative example in which the light-absorbing layer 26 is not provided, the loss of the light energy of the laser light 40 is larger than that in the present embodiment. For example, FIG. 13 is an enlarged plan view of a vicinity of the LED element 200 in a display device of the comparative example. As shown in FIG. 13, there is no layer that receives the laser light (not shown) directly under the semiconductor layer 202, so that the irradiated laser light directly reaches the drive circuit 125 located directly below the semiconductor layer 202. The laser light reached the drive circuit 125 may adversely affect the semiconductor layer 12 of the drive transistor 127.

In the case where the laser light is irradiated so that the entire LED element 200 is in the range by increasing the spot diameter of the laser light, the laser light is reflected by the surface of the terminal electrode 203 made of gold (Au). In this case, an area 30a or area 30b shown by a chain line in FIG. 13 remains slightly heated, it is difficult to efficiently transfer heat to the junction of the connecting electrode 103 and the terminal electrode 203.

(Variation 1)

In the present embodiment, although an example of using near-infrared light as the laser light 40 is shown, but the present invention is not limited to this example. The laser light 40 can be selected from laser lights having an appropriate wavelength according to the semiconductor material and the like constituting the semiconductor layer 202 of the LED element 200. For example, the laser light 40 may be infrared light with a wavelength longer than near-infrared light. The laser light 40 may be visible light with a wavelength shorter than near-infrared light (e.g., green laser light). Regardless of which laser light is used, it is desirable to select the material of the light-absorbing layer 26 so that the laser light 40 can be efficiently absorbed according to the wavelength of the laser light 40 to be used.

(Variation 2)

In the first embodiment, although an example in which a metal material such as tungsten is used as a material of the light-absorbing layer 26, the material of the light-absorbing layer 26 is not limited to the above-described example. For example, a carbon-containing layer such as graphite or carbon (including diamond-like carbon) may be used for the light-absorbing layer 26. The carbon-containing layer has very high near-infrared light absorptivity and can efficiently convert near-infrared light to thermal energy.

The carbon-containing layer may be used as a single layer or may be used by stacking another metal layer and a carbon-containing layer. For example, it may be a structure in which a carbon-containing layer is stacked on a metal layer composed of a metal material such as tungsten, aluminum, chromium, cobalt, molybdenum, titanium, zinc, nickel, or iron. In this case, the light-absorbing layer 26 can absorb infrared light in the carbon-containing layer and convert it into thermal energy, and the thermal energy can be transferred to the connecting electrode 103 by the metal layer.

Second Embodiment

In the present embodiment, a display device having a pixel configuration different from that of the first embodiment will be described. Specifically, the display device of the present embodiment is different from the display device 10 of the first embodiment in the configuration of the pixel 110. In the present embodiment, portions different from those of the first embodiment will be described. In the drawings used in the description of the present embodiment, the same components as those of the first embodiment are denoted by the same symbols, and detailed description thereof is omitted.

[Cross-Sectional Structure of Pixel]

Figure 14:
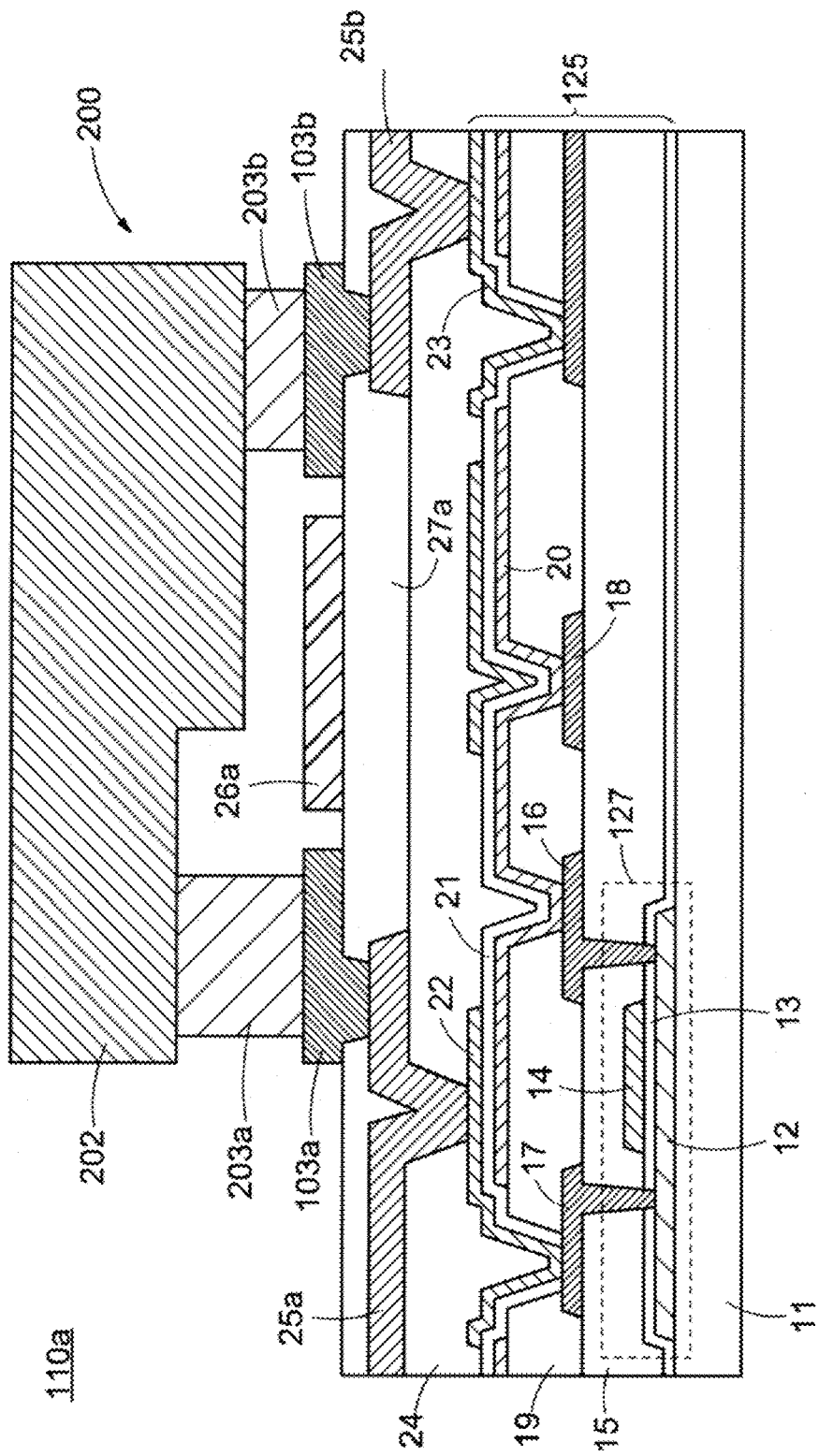
FIG. 14 is a cross-sectional view of a pixel configuration in a display device of a second embodiment of the present invention.

FIG. 14 is a cross-sectional view showing a configuration of a pixel 110a in a display device according to a second embodiment. As shown in FIG. 14, in the present embodiment, a light-absorbing layer 26a is provided in the same layer as the connecting electrode 103. Specifically, the light-absorbing layer 26a is arranged between the connecting electrode 103a and the connecting electrode 103b so as not to cause a short circuit. Therefore, in the present embodiment, the heat radiated from the light-absorbing layer 26a is transferred to the connecting electrode 103 via an insulating layer 27a. By sufficiently shortening the distance between the light-absorbing layer 26a and the connecting electrode 103, heat can be efficiently transferred.

In the present embodiment, although a material containing aluminum oxide is used as the light-absorbing layer 26, other metal materials described in the first embodiment may be used. However, it is desirable to use a material having a melting point higher than that of the connecting electrode 103 as a material of the light-absorbing layer 26a. Therefore, in the present embodiment, the light-absorbing layer 26a is formed by a process different from the connecting electrode 103

The insulating layer 27a of the present embodiment may be made of an insulating material different from that of the first embodiment. In the present embodiment, the heat generated in the light-absorbing layer 26a is better not transmitted toward the drive circuit 125. Therefore, it is preferred to use an insulating material having a relatively low thermal conductivity (e.g., silicon oxide and the like) as the material of the insulating layer 27a of the present embodiment.

[Manufacturing Method of Display Device]

Figure 15:
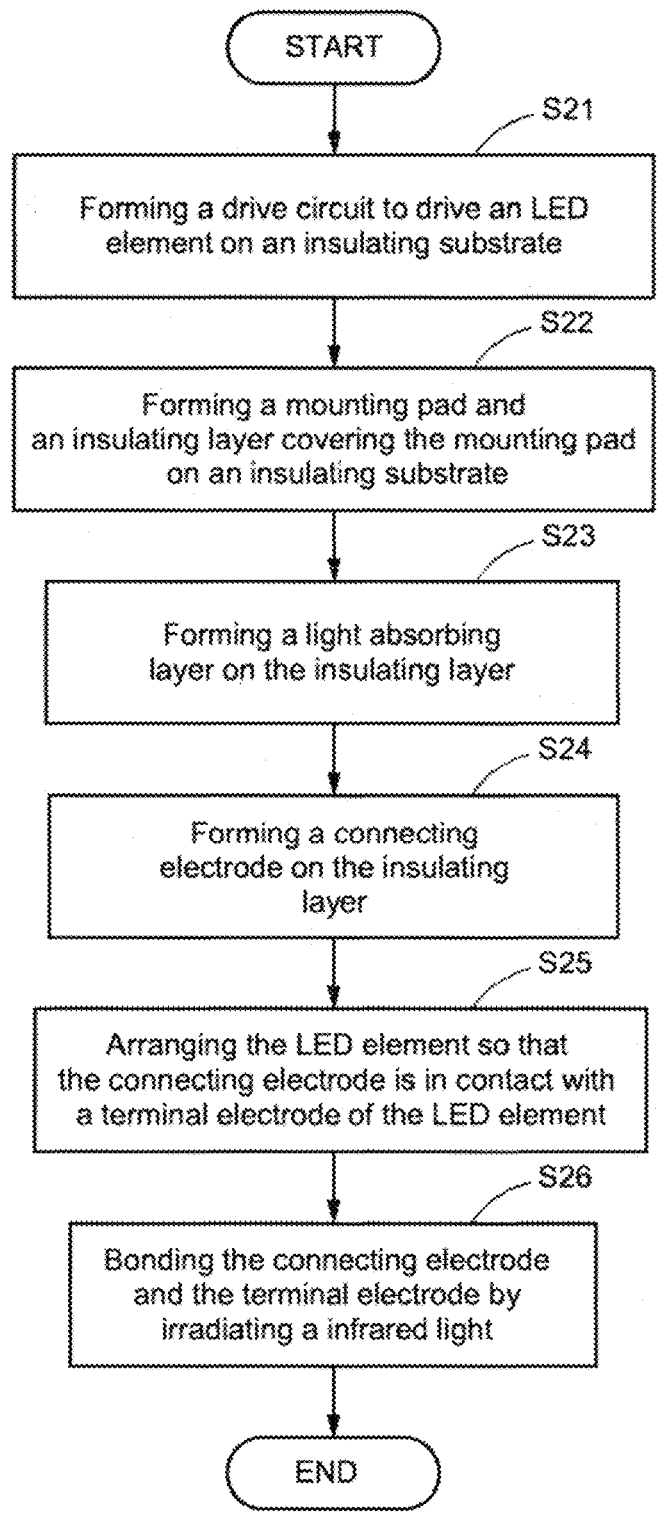
FIG. 15 is a flowchart diagram of a manufacturing method of the display device according to the second embodiment of the present invention.

FIG. 15 is a flowchart diagram showing a manufacturing method of the display device according to the second embodiment of the present invention. FIG. 16 to FIG. 21 are cross-sectional views showing a manufacturing method of the display device according to the second embodiment of the present invention. Hereinafter, a manufacturing method of a display device of the present embodiment will be described with reference to FIG. 15. At that time, a cross-sectional structure in each manufacturing process will be described with reference to FIG. 16 to FIG. 21.

Figure 16:
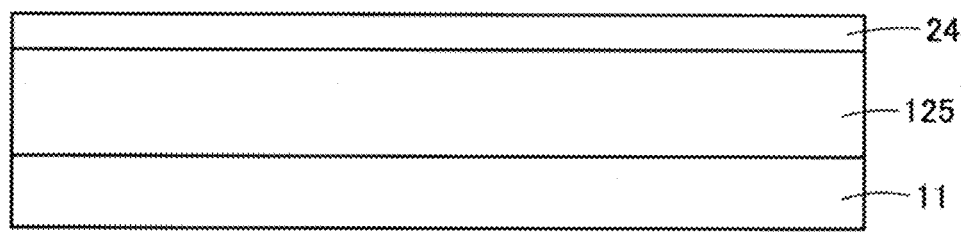
FIG. 16 is a cross-sectional view of a manufacturing process of the display device according to the second embodiment of the present invention.

First, in step S21 of FIG. 15, the drive circuit 125 for driving the LED element 200 is formed on the insulating substrate 11. FIG. 16 shows a cross-sectional structure corresponding to step S21 of FIG. 15. The insulating substrate 11 and the drive transistor 127 are the same as in the first embodiment. After the drive circuit 125 is formed on the insulating substrate 11, the planarization layer 24 is formed to planarize undulations caused by the drive circuit 125.

Figure 17:
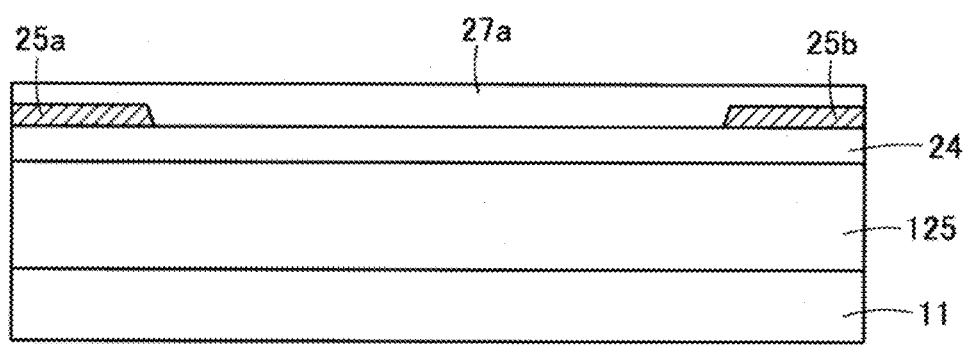
FIG. 17 is a cross-sectional view of a manufacturing process of the display device according to the second embodiment of the present invention.

Next, in step S22 of FIG. 15, the mounting pad 25a and the mounting pad 25b are formed on the drive circuit 125 (specifically, on the planarization layer 24 covering the drive circuit 125) and the insulating layer 27a is formed. FIG. 17 shows a cross-sectional structure corresponding to step S22 of FIG. 15. Although not shown, the mounting pads 25a and 25b are connected to the anode electrode 22 and the cathode electrode 23, respectively. In the present embodiment, the insulating layer 27a is a silicon-oxide layer.

Figure 18:
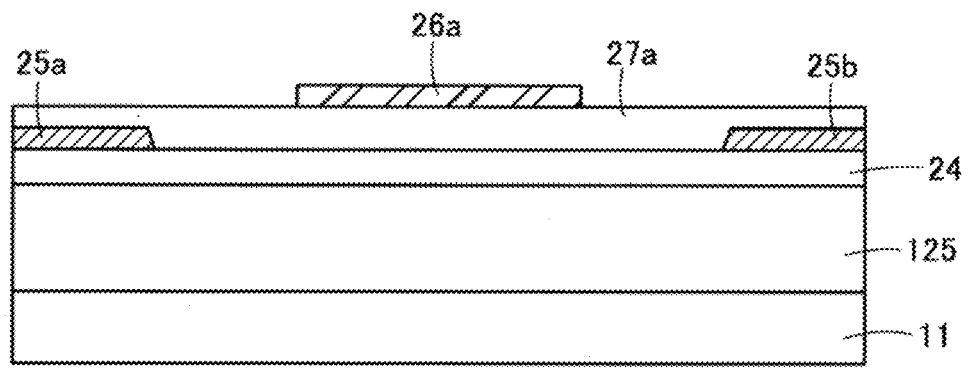
FIG. 18 is a cross-sectional view of a manufacturing process of the display device according to the second embodiment of the present invention.

Next, in step S23 of FIG. 15, the light-absorbing layer 26a is formed on the insulating layer 27a. FIG. 18 shows a cross-sectional structure corresponding to step S23 of FIG. 15. In the present embodiment, aluminum oxide is used as a constituent material of the light-absorbing layer 26a. The light-absorbing layer 26a can be formed by, for example, a sputtering method.

Figure 19:
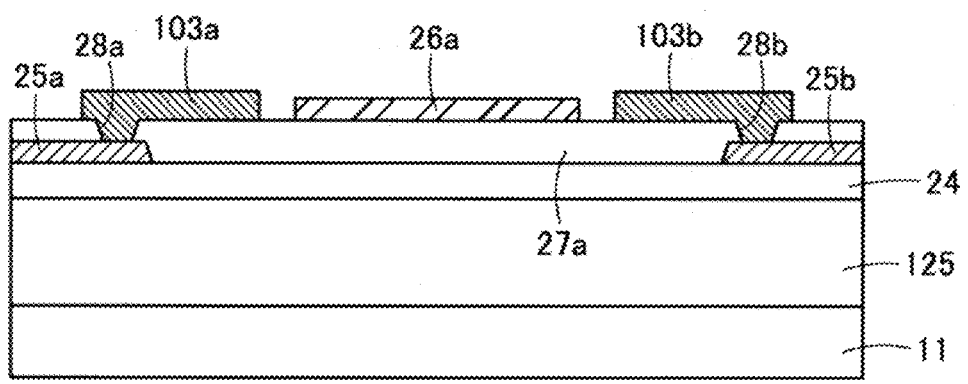
FIG. 19 is a cross-sectional view of a manufacturing process of the display device according to the second embodiment of the present invention.

Next, in step S24 of FIG. 15, the connecting electrode 103a and the connecting electrode 103b electrically connected to the drive circuit 125 are formed on the insulating layer 27a. FIG. 19 shows a cross-sectional structure corresponding to step S24 of FIG. 15. As in the first embodiment, the connecting electrode 103 is formed to match the position of the mounting pad 25. Specifically, the opening 28a and the opening 28b are formed on the insulating layer 27a at a position corresponding to the mounting pads 25a and 25b, respectively. Thereafter, the connecting electrode 103 that is electrically connected to the mounting pad 25 is formed on the insulating layer 27a.

In the present embodiment, tin (Sn) is used as a constituent material of the connecting electrode 103. In the present embodiment, the connecting electrode 103 is formed in the same layer as the light-absorbing layer 26a. Specifically, the connecting electrode 103 is formed so that the light-absorbing layer 26a is positioned between the connecting electrode 103a and the connecting electrode 103b.

Figure 20:
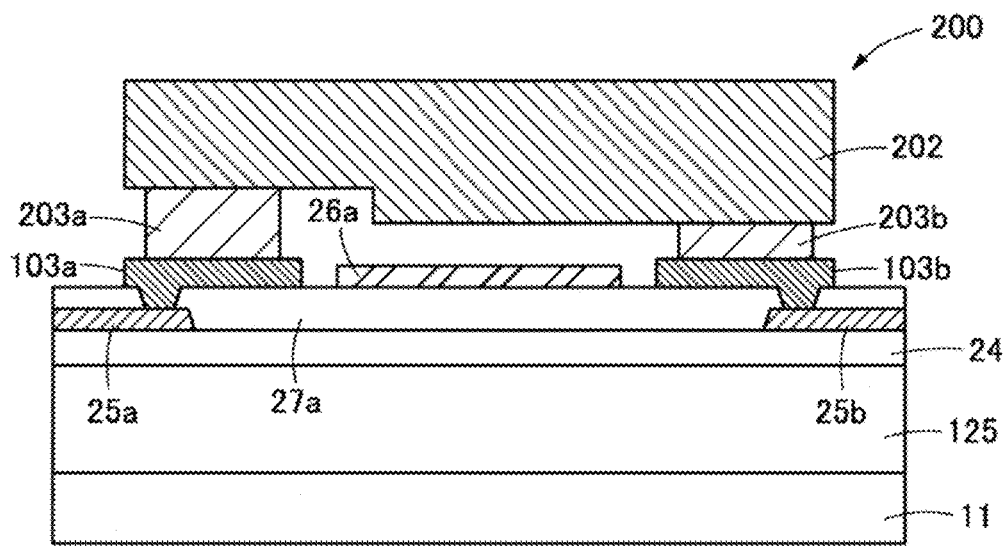
FIG. 20 is a cross-sectional view of a manufacturing process of the display device according to the second embodiment of the present invention.

Next, in step S25 of FIG. 15, the LED element 200 is arranged so that the connecting electrode 103 and the terminal electrode 203 of the LED element 200 are in contact with each other. FIG. 20 shows a cross-sectional structure corresponding to step S25 of FIG. 15. Since the process shown in step S25 of FIG. 15 is the same as that of the first embodiment, a detailed description thereof is omitted.

Figure 21:
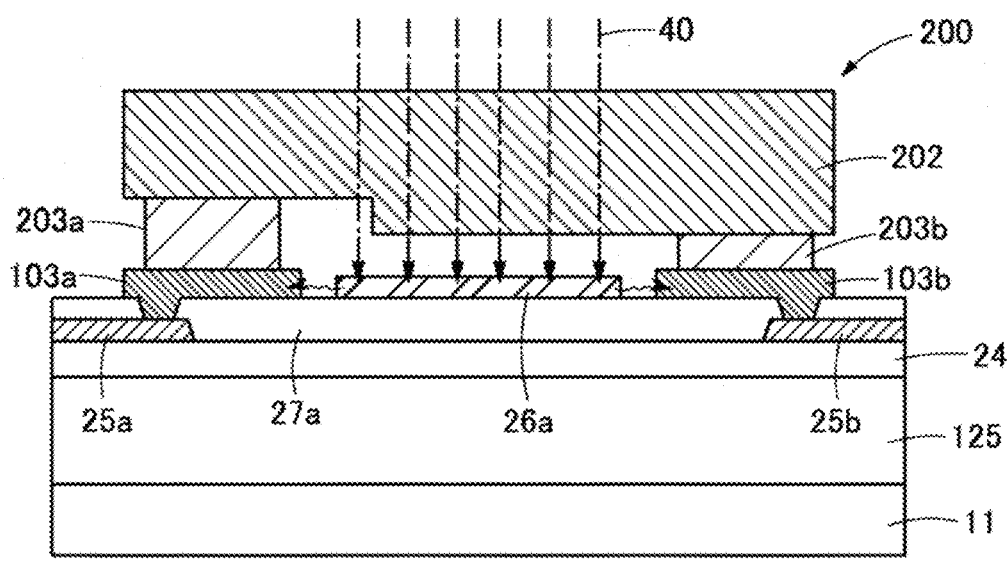
FIG. 21 is a cross-sectional view of a manufacturing process of the display device according to the second embodiment of the present invention.

Next, in step S26 of FIG. 15, the connecting electrode 103 and the terminal electrode 203 are bonded by irradiating the light-absorbing layer 26a with the laser light 40 via the semiconductor layer 202 of the LED element 200. FIG. 21 shows a cross-sectional structure corresponding to step S26 of FIG. 15. In the present embodiment, near-infrared light (wavelength: about 1064 nm) emitted from a YAG laser or $YVO_4$ laser is used as the laser light 40.

As shown in FIG. 21, the laser light 40 emitted from an external light source is transmitted through the semiconductor layer 202 of the LED element 200 and is irradiated to the light-absorbing layer 26a. In the present embodiment, since the semiconductor layer 202 is a gallium nitride-based semiconducting material, it transmits near-infrared light. On the other hand, since a material containing aluminum oxide having a relatively high absorptivity to near-infrared light is used as the light-absorbing layer 26, the laser light 40 is efficiently absorbed and converted into heat.

The heat generated in the light-absorbing layer 26a is transferred to the connecting electrode 103 arranged in the same layer via the insulating layer 27a. The heat transferred to the connecting electrode 103 is also transferred to the terminal electrode 203 of the LED element 200. That is, due to the thermal radiation from the light-absorbing layer 26a, sufficient heat is transferred to the interface between the connecting electrode 103 and the terminal electrode 203, and the connecting electrode 103 and the terminal electrode 203 are melt-bonded. Therefore, as in the first embodiment, the connecting electrode 103 and the terminal electrode 203 are firmly bonded by forming an alloy layer composed of a eutectic alloy between the connecting electrode 103 and the terminal electrode 203.

Each of the embodiments described above as an embodiment of the present invention can be appropriately combined and implemented as long as they do not contradict each other. The addition, deletion, or design change of components as appropriate, or the addition, deletion, or condition change of processes by those skilled in the art based on each embodiment are also included in the scope of the present invention as long as they are provided with the gist of the present invention.

Further, it is understood that, even if the effect is different from those provided by each of the above-described embodiments, the effect obvious from the description in the specification or easily predicted by the person skilled in the art is apparently derived from the present invention.

What is claimed is:

1. A method for manufacturing a display device comprising:
    forming a drive circuit to drive an LED element on an insulating substrate;
    forming a light absorbing layer on the drive circuit;
    forming an insulating layer covering the light absorbing layer;
    forming a connecting electrode electrically connected to the drive circuit;
    arranging the LED element so that the connecting electrode is in contact with a terminal electrode of the LED element; and
    bonding the connecting electrode and the terminal electrode by irradiating laser light through a semiconductor layer of the LED element to the light absorbing layer.

2. The method for manufacturing the display device according to claim 1, wherein
    the light absorbing layer is heated by irradiation of the laser light and the heat generated in the light absorbing layer is transferred to the connecting electrode and the terminal electrode through the insulating layer.

3. The method for manufacturing the display device according to claim 1, wherein
    the light absorbing layer is a metal layer containing tungsten, chromium, cobalt, molybdenum, titanium, zinc, nickel, or iron.

4. The method for manufacturing the display device according to claim 1, wherein
    the insulating layer is an aluminum oxide layer.

5. The method for manufacturing the display device according to claim 1, wherein
    bonding the connecting electrode and the terminal electrode includes forming an alloy layer containing the constituent materials of the connecting electrode and the terminal electrode.

6. The method for manufacturing the display device according to claim 5, wherein
    the light absorbing layer has a higher melting point than the alloy layer.

7. The method for manufacturing the display device according to claim 1, wherein
    the laser light is near-infrared light emitted from a YAG laser or $YVO_4$ laser.

8. The method for manufacturing the display device according to claim 1, wherein the connecting electrode is formed so as to overlap a part of the light absorbing layer in a plan view.

* * * * *